US005944097A

United States Patent [19]
Gungor et al.

[11] Patent Number: 5,944,097
[45] Date of Patent: Aug. 31, 1999

[54] COMPOSITE SUBSTRATE CARRIER FOR HIGH POWER ELECTRONIC DEVICES

[75] Inventors: Mehmet N. Gungor, Pittsburgh, Pa.; J. Donald Gardner, Jr., Columbia; William R. Larimer, Baltimore, both of Md.

[73] Assignee: Northrop Grumman Corporation, Los Angeles, Calif.

[21] Appl. No.: 08/852,025

[22] Filed: May 6, 1997

[51] Int. Cl.⁶ .................................................... F28F 7/00
[52] U.S. Cl. ..................... 165/185; 165/80.2; 165/80.3; 164/97; 164/6; 427/249; 428/209; 257/720
[58] Field of Search ................................. 165/185, 80.2, 165/80.3; 164/97, 6; 427/249; 428/209; 257/720

[56] References Cited

U.S. PATENT DOCUMENTS

| | | | |
|---|---|---|---|
| 4,871,008 | 10/1989 | Dwivedi et al. | 164/6 |
| 5,020,583 | 6/1991 | Aghajanian et al. | 164/97 |
| 5,063,121 | 11/1991 | Sato et al. | 428/698 |
| 5,224,017 | 6/1993 | Martin | 165/185 |
| 5,246,736 | 9/1993 | Gougard et al. | 427/249 |
| 5,287,248 | 2/1994 | Montesano | 165/185 |
| 5,347,426 | 9/1994 | Dermarkar et al. | 165/185 |
| 5,407,727 | 4/1995 | Newell | 165/185 |
| 5,623,394 | 4/1997 | Sherif et al. | 165/185 |
| 5,653,280 | 8/1997 | Porter | 165/185 |
| 5,660,917 | 8/1997 | Fujimori et al. | 165/185 |
| 5,757,620 | 5/1998 | Edwards et al. | 165/185 |

Primary Examiner—Ira S. Lazarus
Assistant Examiner—Terrell McKinnon

[57] ABSTRACT

A substrate carrier for a ceramic substrate which supports one or more high power semiconductor devices which is fabricated from a metal base composite and which includes strategically located high conductivity copper based inserts to provide an effective heat transfer path to a heat sink for high power electronic devices. The coefficient of thermal expansion of both the metal based composite and the copper based inserts substantially match that of the substrate. The substrate carrier is formed by a pressure casting process where a porous preform of SiC, for example, is infiltrated with molten aluminum.

25 Claims, 2 Drawing Sheets

COMPOSITE SUBSTRATE CARRIER FOR HIGH POWER ELECTRONIC DEVICES

BACKGROUND OF THE INVENTION

1. Field of the Invention

This invention relates generally to the dissipation of heat from high power electronic devices, and more particularly to a substrate carrier situated between a substrate supporting the high power electronic devices and a heat sink.

2. Description of Related Art

Systems utilizing electronic devices such as high power transistors encounter an ever-present problem of thermal management, that is, designing structures which are capable of efficiently conducting the heat generated by these devices, away from the substrates upon which they are mounted and the electronic packaging within which they are located. Furthermore, where such systems, such as radar systems, are located in high speed aircraft, weight introduces an added design problem.

Currently, high power communications and radar transmitters are utilizing heat generating semiconductor devices implemented in silicon carbide as well as silicon and gallium arsenide. These devices, moreover, are mounted on ceramic type substrates comprised of materials which attempt to match its coefficient of thermal expansion to that of an adjoining heat dissipating element, such as a cold plate, so that fracture and catastrophic failures due to uneven expansion due to heat are reduced. This has resulted in the use of some type of substrate carrier located between the substrate and the cold plate, and where the coefficient of thermal expansion of the carrier is tailored to match that of the substrate to prevent dimensional instability tending to cause device failure as a result of different degrees of expansion during operation in a relatively high thermal environment.

SUMMARY

Accordingly, it is an object of the present invention to provide an improvement in substrate carriers for high power electronic devices.

It is another object of the invention to provide an improved substrate carrier which has the properties of low density, low thermal expansion and relatively high thermal conductivity.

It is a further object of the invention to provide a substrate carrier for high power electronic devices which results in reduction of weight and increased thermal performance.

The foregoing and other objects are achieved by a substrate carrier which is fabricated from a metal base composite and which includes strategically located high conductivity copper based inserts to provide an effective heat transfer path to a heat sink for neighboring heat generating sources comprised of high power electronic devices.

The foregoing and other objects are further achieved by a hybrid metal based composite substrate carrier formed by pressure casting and comprised of porous material having a relatively low thermal expansion and which has been infiltrated with molten aluminum or the like and having selectively located regions of copper based inserts. The coefficient of thermal expansion (CTE) of the aluminum based composite is tailored to match the CTE of a ceramic substrate with which it is to be used, with the copper based inserts also having a matching CTE while providing an effective heat transfer path to an adjoining heat sink.

The fabrication process involves the formation of a non-metallic preform comprised of, for example, silicon carbide which results in a microstructure designed to have a predetermined level of void volume fraction or open structure which will be filled with molten aluminum in a subsequent processing step. Next, one or more metal insert holes or openings are formed in the preform, e.g. being cut out, for the reception of respective copper based material inserts which have the same shape as the holes cut out of the preform. The inserts are then mounted in the preform. This is followed by an infiltration of the preform material by molten aluminum. This step is carried out at a temperature above the melting point of aluminum but below the melting point of copper. After infiltration, the infiltrated composite is ready for use as a substrate carrier.

Further scope of applicability of the present invention will become apparent from the detailed description given hereinafter. It should be understood, however, that the detailed description and specific example, while indicating the preferred embodiment and process of fabrication, are provided by way of illustration only, since various changes and modifications within the spirit and scope of the invention will become apparent to those skilled in the art from this detailed description.

BRIEF DESCRIPTION OF THE DRAWINGS

The present invention will be more fully understood from the detailed description provided herein below in the accompanying drawings which are given by way of illustration only, and thus are not intended to be limitative of the present invention, and wherein.

DETAILED DESCRIPTION OF THE INVENTION

This invention is directed to an electronic substrate carrier and its method of fabrication for high power transistors currently being used in the design of electronic equipment requiring highly efficient thermal management.

The material from which the carrier is fabricated is a metal based composite design to meet the following requirements for such apparatus as airborne radar systems: (a) lightness of weight and high specific stiffness suitable for high speed airborne applications; (b) thermal compatibility with electronic ceramic substrates on which are mounted heat generating devices such as high power transistors fabricated in silicon carbide, silicon and gallium arsenide; (c) high thermal conductivity; and (d) low manufacturing costs.

The material utilized comprises a hybrid metal based composite consisting of an aluminum matrix, reinforced with either ceramic particulate such as silicon carbide or boron carbide, diamond powder or fibrous material such as graphite. One or more high conductivity copper based inserts are strategically placed in openings located therein.

Whereas the primary function of the aluminum composite carrier is to provide a matched coefficient of thermal expansion (CTE) with an adjoining electronic ceramic substrate containing an assembly of circuit components including active semiconductive devices such as high power transistors, the main purpose of the copper based inserts is to provide an effective heat transfer path from the heat generating semiconductor devices to an underlying heat sink such as a cold plate.

Figure 1:
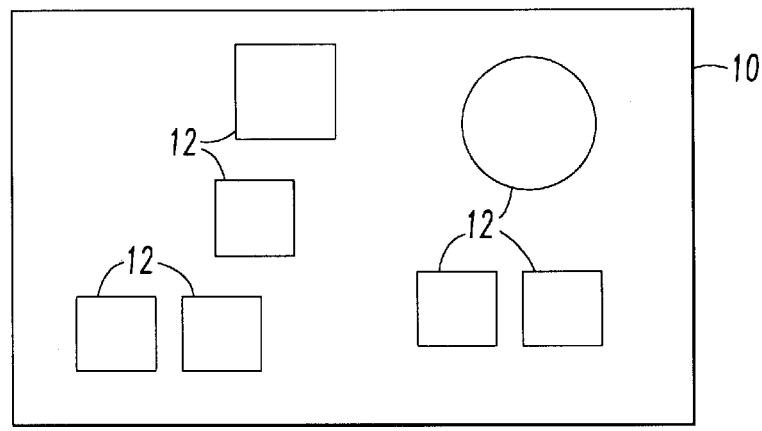
FIG. 1 is a top elevational view generally illustrative of a substrate carrier in accordance with the subject invention.
Figure 2:
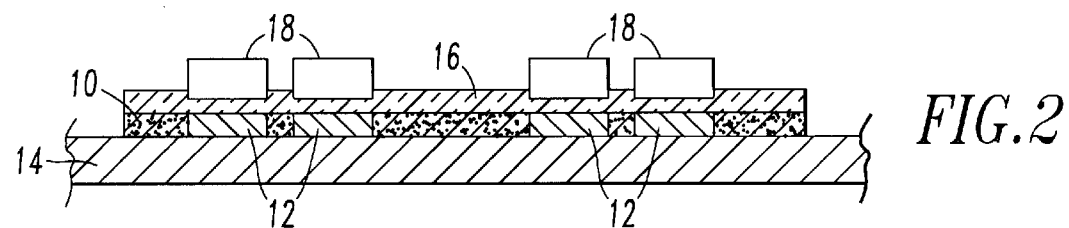
FIG. 2 is a partial longitudinal cross section generally illustrative of the substrate carrier shown in FIG. 1 being located between a ceramic substrate and a metal heat sink.
Figure 3:
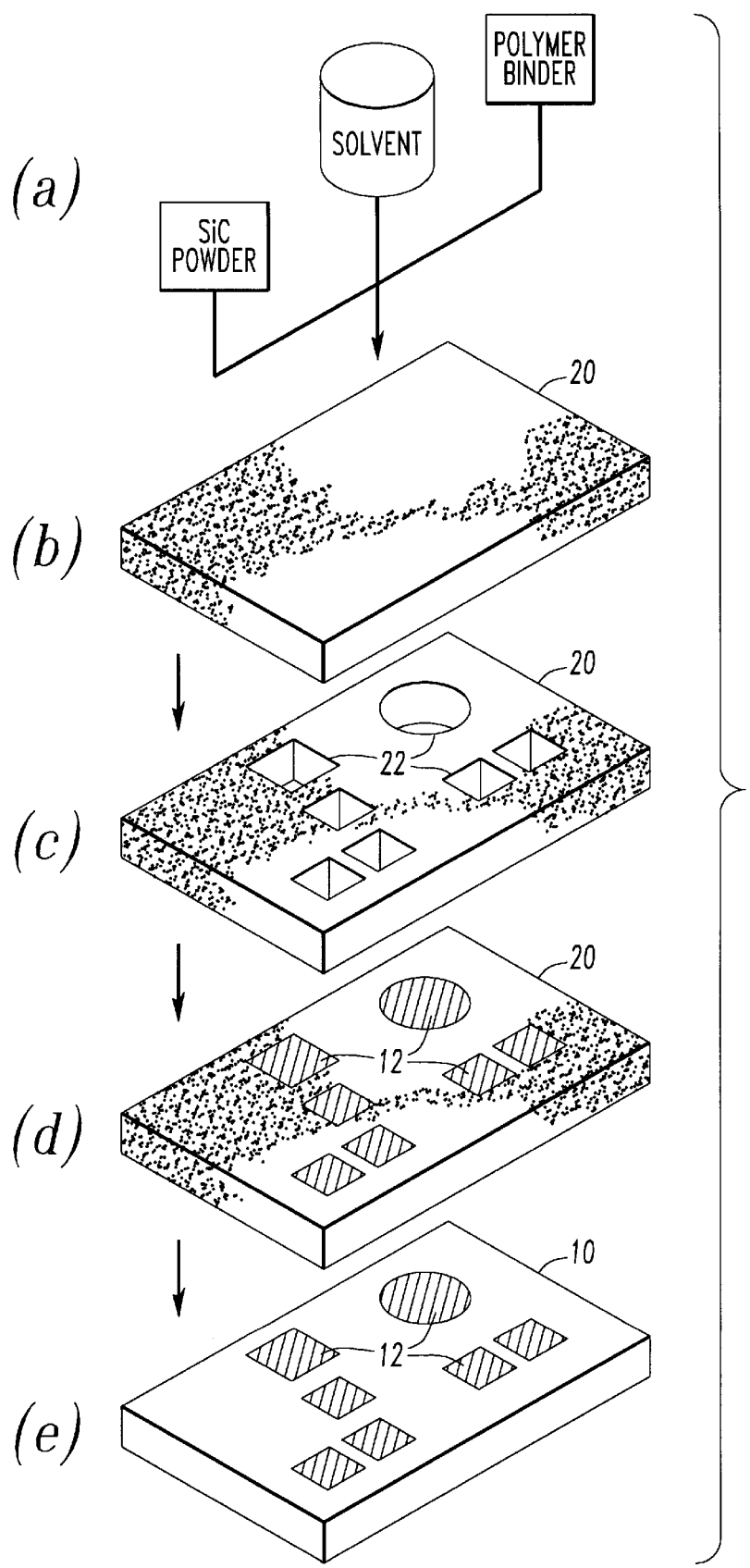
FIGS. 3(a)–3(e) are illustrative of the steps involved in the fabrication of the composite substrate carrier shown in FIG. 1.

Referring now to the drawings and more particularly to FIG. 1, reference numeral 10 denotes a generally rectangular shaped composite substrate carrier formed from a preform structure 20, shown in FIG. 3(b), and having a plurality of copper (Cu) based inserts 12 of various shapes and sizes selectively located therein as shown in FIG. 3(d). As shown in the cross section of FIG. 2, the substrate carrier 10 is located between a generally flat metallic heat sink member 14 and a ceramic substrate 16 having a plurality of heat generating electronic devices 18, e.g. transistors, supported thereby. It is to be noted that the copper based inserts 12 in the carrier 10 are located directly beneath the heat generating devices 18 and match their "footprint" for conducting the heat generated by these devices to the heat sink 14.

The preferred material for the substrate carrier 10 comprises an aluminum (Al)—silicon carbide (SiC) matrix having a relatively high stiffness, an example being an Al—65% SiC composite which exhibits an elastic stiffness of $20 \times 10^6$ psi which is 250% higher than that of aluminum per se. Such a property provides an opportunity to design stiff and thin cross section carriers which can result in a potential weight savings of a considerable magnitude.

The fabrication of the composite material involves the initial fabrication of a non-metallic preform 20, shown in FIG. 3(a), comprised of porous material having a relatively low thermal expansion, below 4 ppm/°C. While boron carbide ($B_4C$) or graphite fiber can be utilized, silicon carbide (SiC) at present constitutes the preferred material from which the preform 20 is constructed.

The preform 20 comprises a microstructure designed to have a predetermined fraction of void volume or open structure that is to be subsequently filled with molten aluminum. The volume fraction of preform material is determined by its type and by the final CTE requirement of the finished aluminum composite. For example, in the case of an SiC particulate preform 20, the volume fraction of SiC is in the range of 0.58 to 0.65 and is sufficient to obtain composite CTE values in the range of 6 to 9 ppm/°C. when the voids of the preform are subsequently filled by molten aluminum. In a structure having graphite fiber reinforcement, the volume fraction of 0.60 graphite fibers is sufficient enough to produce CTE values of less than 5 ppm/°C. The thermal conductivity of an aluminum matrix composite such as described above, will have a range of 160–200 Wm/K.

With respect to the copper based inserts 12, depending upon the heat flux generated by the devices 18 (FIG. 2) with which they are adjacently located, they are designed taking into account the required thermal conductivity needed for that particular device. For example, copper based materials can comprise Cu-diamond (>500 Wm/K), Cu-Gr(>400 Wm/K), Cu-BeO (>300 Wm/K), Cu-Mo-Cu (240 Wm/K).

It is desirable that the fabricator not only match the CTE of the Al-based composite substrate carrier 10 to that of electronic substrate 16 (FIG. 2), but also to match the CTE of the Al-based substrate carrier 10 to the Cu-based inserts 12 so that the CTEs of all three components, the substrate carrier 10, the Cu inserts 12 and the ceramic substrate 16 are substantially matched. For example, the CTEs of Al—50% to 65% SiC composite 10, a Cu/Mo/Cu insert 12 and a low temperature cofired ceramic (LTCC) substrate 16 are 6–8 ppm/°C., 6-7 ppm/°C., and 5–7 ppm/°C., respectively. Thus fine tuning the CTEs of the aluminum composite substrate carrier 10 and the Cu inserts 12 can be designed by adjusting the composite in order to match a given CT of the ceramic substrate 16 with which it is used.

While there are various processes by which a preform 20 and composite materials such as SiC can be integrated into a substrate carrier 10, for example, using methods of injection molding and slurry type casting while graphite fiber preforms can be fabricated by filament winding, a preferred method of fabrication is shown by the steps depicted in FIGS. 3(a)–3(e). Directing attention now to these figures, in FIG. 3(c), SiC particles in a powder are mixed with a polymer binder such as methyl methacrylate acrylic polymer in a solvent such as methyl ethyl ketone to form a slurry which is then injection molded into a preform structure 20 as shown in FIG. 3(b). The preform 20 comprises a porous structure having the overall shape of the final substrate carrier 10 (FIG. 1) which is then heated to remove the polymer binder through evaporation at temperatures typically above 250° C.

A plurality of openings or holes 22 conforming to the shape of respective copper based inserts 12 to be subsequently inserted therein, are formed in the preform 20 as shown in FIG. 3(c). This can be preformed manually after the preform fabrication process of FIG. 3(b), such as by cutting material portions out of the body of the preform 20, for example by using a knife blade or it can be integrated into the molding step of FIG. 3(b) where an injection molding process is carried out with a mold including means for forming the holes 22 at the same time the preform 20 is made.

The preform 20 is at this stage ready to be inserted with one or more high thermal conductivity inserts 12, the location, size and shape of the inserts being predicated by the footprints of the heat generating devices 18 supported by the electronic substrate 16 shown in FIG. 2. The inserts 12 are formed from commercially available materials, e.g. Cu/Mo/Cu on specially fabricated e.g. Cu-based diamond particle reinforced composite. Commercially available inserts 12 are cut or machined to the required shape and size. It should be noted that the dimensions of the holes 22 which are to receive the metallic inserts 12, are slightly undercut so that the metallic inserts 12 are lightly forced fit into the holes 22 to assure that the preform 20 holds the inserts 12 in place securely until a last stage of fabrication takes place as shown in FIG. 3(e). If the inserts 12 are not commercially available, they must be fabricated using usual composite fabrication practices. For instance, in the fabrication of Cu matrix-diamond particle reinforced composite, one can use conventional powder metallurgic processing techniques such as vacuum hot pressing of Cu and diamond particle blends, or molten Cu infiltration of diamond particulate preforms which can be fabricated using similar techniques that are used to fabricate the SiC preform 20 shown in FIGS. 3(a) and 3(b).

Once the preform 20 containing the inserts 12 is prepared, the next step, FIG. 3(e), is the infiltration of the porous material of the preform 20 by molten aluminum to form the composite substrate carrier 10 of FIG. 1. The preferred method of Al infiltration is by way of pressure casting using apparatus for which is shown schematically in FIG. 4.

Figure 4:
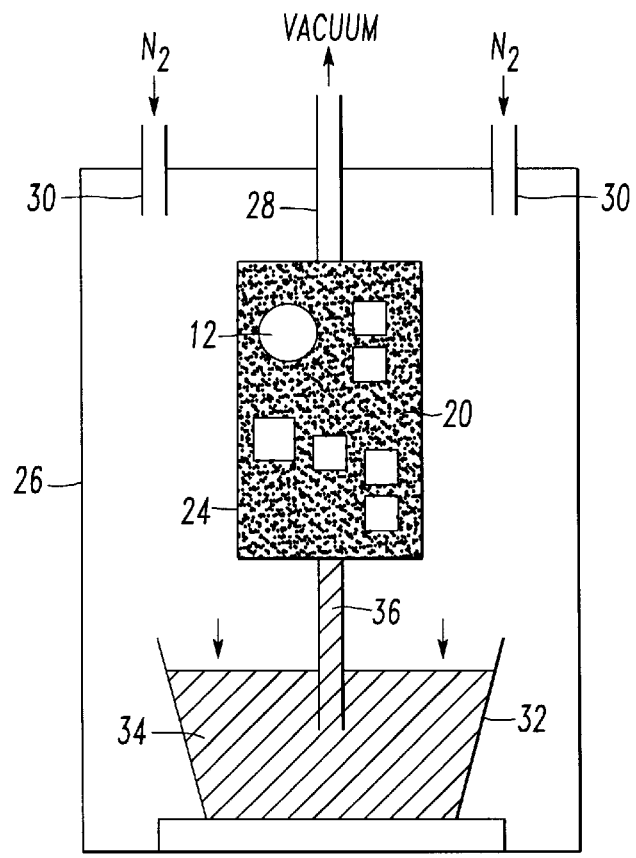
FIG. 4 is a schematic diagram generally illustrative of apparatus for carrying out a pressure casting infiltration process utilized in the fabrication process shown in FIG. 3(e).

As shown in FIG. 4, a preform 20 including one or more Cu based inserts 12 is sealed in a mold 24, which is then placed in a pressure chamber 26. The chamber 26, in addition to having an evacuation pipe 28 and a pair of pressurization pipes 30, includes a crucible 32 into which solid pieces of aluminum alloy are placed. The chamber 26 is closed and evacuated. The solid aluminum pieces are heated above the melting point of aluminum (>700° C.) where it is in molten form as shown by reference numeral 34. The temperature of the sealed preform 20 is kept at a temperature of about 650° C., which is below the melting point of the copper based inserts 12. When desired temperatures are reached, the sealed preform 20 is connected with the molten metal 34 in the crucible 32 through a bottom filling pipe 36.

Following this, the entire chamber 26 is pressurized through the pipes 30 with nitrogen ($N_2$) up to a pressure of between 1000 and 1300 psi, which causes the molten aluminum 34 to enter the preform 20 through the bottom filling pipe 36. The porous preform 20 is immediately infiltrated with the molten aluminum 34. Because the melting temperature of the Cu inserts 12 are much higher than that of aluminum, i.e. 1083° C. the inserts 12 remain solid during an infiltration. Also, infiltration takes place in a very short time, a few seconds or less, causing the chemical integrity of the Cu inserts 12 to be preserved. This means that the dissolution of Cu in Al is only limited to a few atomic layer distances to allow the inserts 12 to be metallurgically bonded to the aluminum, which is very desirable. After infiltration, power is turned off and the chamber 26 is allowed to cool and become depressurized. The infiltrated composite which is now the carrier 10, is taken from the sealed preform container 24 and is ready for use as a substrate carrier 10.

Thus what has been shown and described is an improved metal matrix composite substrate carrier for high power electronic devices, such as transistors, using a pressure casting technique that results in a reduction of the cost of current expensive, labor oriented manufacturing practices.

Having thus shown and described what is at present considered to be the preferred embodiment and method of its fabrication, it should be noted that the same has been made by way of illustration and not limitation. Accordingly, all modifications and alterations coming within the spirit and scope of the invention as set forth in the appended claims are herein meant to be included.

We claim:

1. A metal matrix composite substrate carrier for a substrate supporting high power, heat generating electronic devices, comprising:

a porous preform structure having a shape conforming to a substrate supporting one or more electronic devices and locatable between a heat sink and said substrate and comprised of non-metallic material, said preform structure being infiltrated with metal to form a hybrid metal based composite, said non-metallic material and said metal being selected so as to provide a composite having a coefficient of thermal expansion which substantially matches the coefficient of thermal expansion of said substrate, and at least one metal insert having relatively high thermal conductivity located in an opening formed in said carrier and affixed thereto for conducting heat generated by an adjacent a heat generating electronic device of said one or more electronic devices away from the substrate to a heat sink and having a size and shape substantially conforming to a footprint of said heat generating electronic device, said metal insert also having a coefficient of thermal expansion which substantially matches that of said substrate.

2. A substrate carrier according to claim 1 wherein said preform structure has a coefficient of thermal expansion which is less than 4 ppm/°C.

3. A substrate carrier according to claim 1 wherein said substrate comprises a ceramic and said metal based composite has a coefficient of thermal expansion which is less than 9 ppm/°C.

4. A substrate carrier according to claim 1 wherein said substrate comprises a ceramic substrate, said non-metallic material of said composite is comprised of a ceramic particulate, and said metal comprises aluminum.

5. A substrate carrier according to claim 4 wherein said ceramic particulate comprises silicon carbide, boron carbide, or diamond powder.

6. A substrate carrier according to claim 1 wherein said substrate comprises a ceramic substrate, said non-metallic material of said composite is comprised of a fibrous material, and said metal comprises aluminum.

7. A substrate carrier according to claim 6 wherein said fibrous material comprises a graphite fiber.

8. A substrate carrier according to claim 1 wherein said at least one metal insert comprises a copper based insert.

9. A substrate carrier according to claim 8 wherein said copper based insert comprises a Cu-diamond insert, a Cu-Gr insert, a Cu—BeO insert, or a Cu/Mo/Cu insert.

10. A substrate carrier according to claim 1 wherein said at least one metal insert comprises a plurality of inserts located under respective heat generating electronic devices of said one or more electronic devices.

11. A method of fabricating a metal matrix composite substrate carrier for a substrate supporting a plurality of heat generating devices having respective footprints on said substrate, comprising the steps of:

(a) fabricating a porous preform structure of non-metallic material having a characteristic of relatively low thermal expansion and including a predetermined fraction of void volume therein;

(b) forming a set of metal insert openings in said preform structure, said openings having respective locations, sizes and shapes substantially conforming to the location and footprints of said heat generating devices;

(c) locating a set of metal inserts in said openings having respective sizes and shapes substantially conforming to the sizes and shapes of said openings and the footprints of said heat generating devices, said inserts being comprised of material having a characteristic of relatively high thermal conductivity; and (d) filling the void volume of the preform structure with metallic material, said materials being selected so as to form a composite substrate carrier structure having a coefficient of thermal expansion which substantially matches that of said substrate.

12. A method of fabricating according to claim 11 wherein said steps (a)–(d) are carried out in succession.

13. A method of fabricating according to claim 11 wherein said steps (a) and (b) are carried out currently.

14. A method of fabricating according to claim 11 wherein said step (d) comprises the step of infiltrating the preform with molten metal.

15. A method of fabricating according to claim 14 wherein said step of infiltrating includes the step of pressure casting to infiltrate the preform with molten aluminum.

16. A method of fabricating according to claim 14 wherein said substrate comprises a ceramic substrate, said non-metallic material of said preform structure is comprised of a ceramic particulate, and said metal comprises aluminum.

17. A method of fabricating according to claim 16 wherein said ceramic particulate comprises silicon carbide, boron carbide, or diamond powder.

18. A method of fabricating according to claim 14 wherein said substrate comprises a ceramic substrate, said non-metallic material of said preform structure is comprised of a fibrous material, and said metal comprises aluminum.

19. A method of fabricating according to claim 18 wherein said fibrous material comprises graphite.

20. A method of fabricating according to claim 14 wherein said metal inserts are comprised of copper based inserts having a melting temperature which is higher than that of aluminum.

21. A method of fabricating according to claim 20 wherein said copper based insert comprises a Cu-diamond insert, a Cu-Gr insert, a Cu—BeO insert, or a Cu/Mo/Cu insert.

22. A method of fabricating according to claim 11 wherein said substrate comprises a ceramic substrate having a coefficient of thermal expansion of between 5 ppm/°C. and 7 ppm/°C.

23. A method of fabricating according to claim 11 wherein said non-metallic material of said preform structure comprises silicon carbide and the metal filling the void volume comprises molten aluminum, whereby a composite is formed having a coefficient of thermal expansion in the range of between 6 ppm/°C. and 9 ppm/°C.

24. A method of fabricating according to claim 11 and wherein said non-metallic material of said preform structure comprises graphite fibers and the metal filling the void volume comprises molten aluminum, whereby a composite is formed having a coefficient of thermal expansion less than 5 ppm/°C.

25. A method of fabricating according to claim 11 wherein said preform structure has a coefficient of thermal expansion of less than 4 ppm/°C.

* * * * *